(12) United States Patent
Foster

(10) Patent No.: US 6,321,173 B1
(45) Date of Patent: Nov. 20, 2001

(54) SYSTEM AND METHOD FOR EFFICIENT VERIFICATION OF FUNCTIONAL EQUIVALENCE BETWEEN DESIGN MODELS

(75) Inventor: Harry D. Foster, Plano, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/209,018

(22) Filed: Dec. 10, 1998

(51) Int. Cl.$^7$ ........................................................ G06F 17/50
(52) U.S. Cl. .................. 702/109; 702/108; 702/118; 714/723; 714/724; 716/1; 716/4
(58) Field of Search .................... 702/109, 108, 702/123, 118, 117; 714/723, 724, 738, 712, 726; 716/1, 4, 5, 18

(56) References Cited

U.S. PATENT DOCUMENTS 5,067,091 * 11/1991 Nakazawa .................................. 716/3
5,331,568 * 7/1994 Pixley ........................................ 716/3
5,754,454   5/1998 Pixley et al. ........................... 702/123

OTHER PUBLICATIONS

Foster, "Techniques for Higher–Performance Boolean Equivalence Verification", The Hewlett–Packard Journal, Article 3, Aug. 1998, pp. 30–38.
Bening, et al., "Physical Design of 0.35–$\mu$m Gate Arrays for Symmetric Multiprocessing Servers", Hewlett–Packard Journal, Article 16, Apr. 1997, pp. 1–12.

* cited by examiner

*Primary Examiner*—Marc S. Hoff
*Assistant Examiner*—Hien Vo

(57) ABSTRACT

An equivalence checking system and method efficiently determine whether different circuit models are functionally equivalent. The equivalence checking system first verifies the functional equivalence of a first circuit model to a second circuit model. In verifying this equivalence, the equivalence checking system produces mapping point pairs. The equivalence checking system utilizes these mapping point pairs in determining whether other models of the circuit are equivalent to the first model. Since the mapping point pairs are reused by the equivalence checking system, the number of new mapping point pairs needed to verify the functional equivalence of the other models is reduced or eliminated. Accordingly, the overall efficiency of the equivalence checking system is increased.

16 Claims, 5 Drawing Sheets

SYSTEM AND METHOD FOR EFFICIENT VERIFICATION OF FUNCTIONAL EQUIVALENCE BETWEEN DESIGN MODELS

BACKGROUND OF THE INVENTION

1. Field of the Invention

The present invention generally relates to semiconductor device designing and, in particular, to a system and method for efficiently verifying the functional equivalence between separate models of a semiconductor design.

2. Related Art

An application-specific integrated circuit (ASIC) is typically designed in stages. For example, in a first stage, a gate design may be generated that exhibits a certain logic (i.e., that produces certain output values based on the values of input signals). In a second stage, the gate design may be reshaped or condensed so that gates implementing the logic may fit onto an ASIC chip or substrate.

It is important to ensure that the logic of the gate design does not change as the designing process progresses from one stage to the next. Therefore, the design of each new stage is usually compared to the design of the previous stage to ensure that no errors were created in generating the new stage. In other words, the logic of the new stage is compared to the logic of the previous stage to ensure that the two stages are functionally equivalent.

One way to verify the functional equivalence of two stages is to compare the output generated by the new stage to the output generated by the previous stage for the same input. However, adequately testing the designs of different stages in this way usually requires the testing of a large number of states. In fact, for many large or complex ASIC circuit designs, the number of states needed to be tested is so great that the cost of equivalence checking in this way is prohibitive.

Therefore, equivalence checkers, which are usually implemented in software, have been designed that verify whether the logic of one stage matches the logic of another stage without having to compare the outputs generated by the different stages for a large number of states. The equivalence checkers build mathematical models of the ASIC design in different stages and mathematically verify that the logic implemented by two different stages are the same. The mathematical comparison of two stages to determine equivalence between the two stages is efficient and is usually the preferred way to verify functional equivalence.

In verifying the functional equivalence of the circuit designs of two different stages, conventional equivalence checkers identify mapping point pairs in the two circuit designs. Mapping point pairs, which are sometimes referred to as "cutpoints", are equivalent points that exist in both designs. For example, a point can often be identified in the design of a first stage that corresponds with a point in the design of a second stage. These corresponding points should always have the same values for a particular set of input values. These two corresponding points define a mapping point pair that can be used by equivalence checkers through techniques known in the art to verify the equivalence of the two circuit designs.

Generally, identifying mapping point pairs is the costliest step, in terms of time, performed by most conventional equivalent checkers. Therefore, the amount of time required to verify the functional equivalence of the various stages of an ASIC design can be significantly reduced if more efficient techniques for determining the mapping point pairs between the different stages are utilized.

Thus, a heretofore unaddressed need exists in the industry for providing a system and method of efficiently determining the mapping point pairs between different models of an ASIC circuit design so that the models can be efficiently checked for functional equivalence.

SUMMARY OF THE INVENTION

The present invention overcomes the inadequacies and deficiencies of the prior art as discussed herein. The present invention provides a system and method for efficiently verifying functional equivalence between different circuit models.

The present invention utilizes a design manager and an equivalence checker. The design manager produces different circuit models based on a first circuit model. The equivalence checker produces mapping point pairs to verify that the first circuit model is functionally equivalent to a second circuit model. The equivalence checker then determines which of the mapping point pairs is valid with respect to a third circuit model. The equivalence checker utilizes the valid mapping point pairs to verify the functional equivalence between the first circuit model and the third circuit model.

The present invention can also be viewed as providing a method for determining functional equivalence between models of circuit designs. Briefly described, the method can be broadly conceptualized by the following steps: providing a first circuit model, a second circuit model, and a third circuit model; verifying that the second circuit model is functionally equivalent to the first circuit model; producing mapping point pairs in performing the verifying step; and utilizing the mapping point pairs to verify that the third circuit model is functionally equivalent to the first circuit model.

The present invention has many advantages, a few of which are delineated hereafter, as mere examples.

An advantage of the present invention is that mapping point pairs produced during one equivalent check can be utilized to perform another equivalent check. Therefore, the number of new mapping point pairs required for the other equivalent check can be reduced.

Another advantage of the present invention is that processing time for performing equivalent checks for a plurality of circuit models can be significantly reduced.

Other features and advantages of the present invention will become apparent to one skilled in the art upon examination of the following detailed description, when read in conjunction with the accompanying drawings. It is intended that all such features and advantages be included herein within the scope of the present invention, as is defined by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE INVENTION

Figure 1:
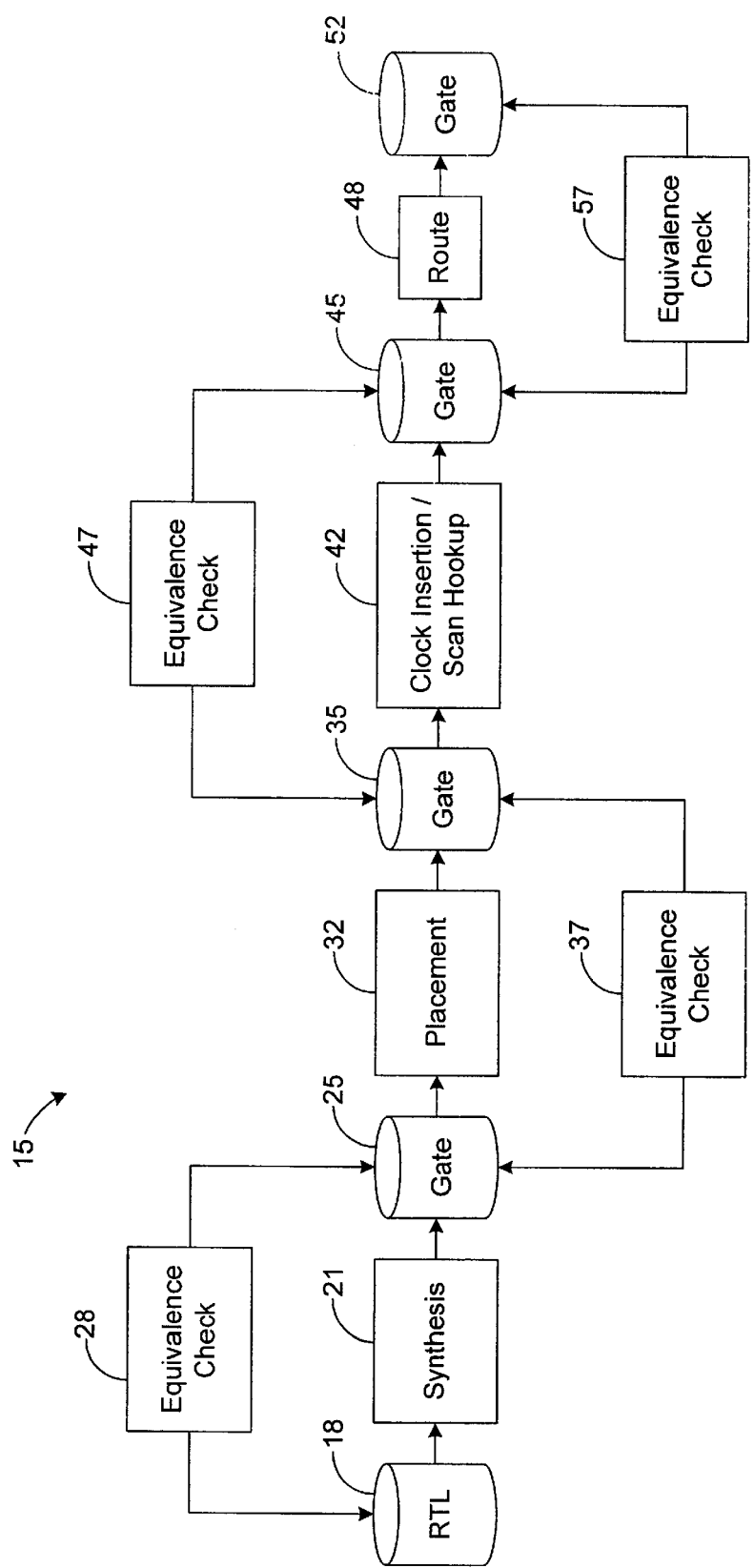
FIG. 1 depicts a process flow diagram of a conventional ASIC design process.

FIG. 1 depicts a process flow for a conventional application-specific integrated circuit (ASIC) design process 15. Initially, logic is created that defines the functionality of the ASIC being designed. This logic, commonly referred to as "register transfer logic (RTL)", is usually expressed as a list of logical equations and is stored in an RTL specification file 18. As an example, Table A shows an exemplary set of equations that could be stored in the RTL specification file 18:

TABLE A c_a = f1;
c_b = f2;
c_c = f3;
c_y = (c_a & c_b) | c_c.

In Table A above, c_a, c_b, c_c, and c_y are variables and f1, f2, and f3 each define the functionality of a portion of the ASIC being designed. In this regard, f1, f2, and f3 may each represent a logical expression in a form similar to the logical expression used to represent c_y.

Figure 2:
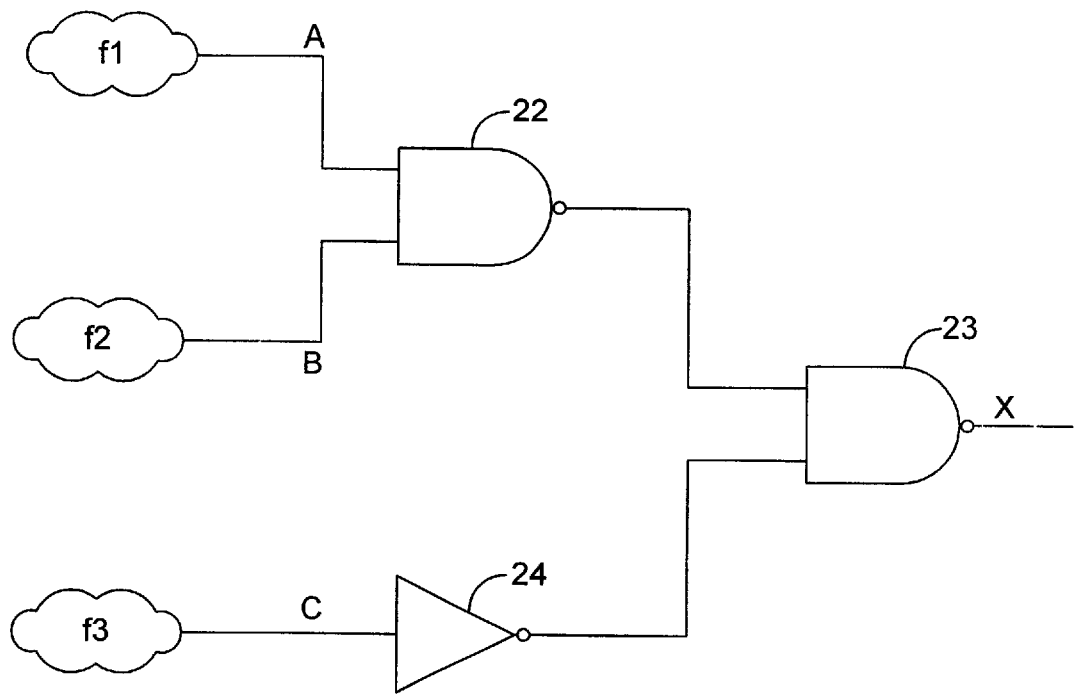
FIG. 2 depicts a gate level implementation of circuitry designed by the design process of FIG. 1.

Once the RTL specification file 18 has been created, a synthesis process 21 is performed on the RTL specification file 18 to create a gate level implementation of the logic defined by the RTL specification file 18. FIG. 2 depicts a gate level implementation of the RTL specification shown in Table A. In this regard, gates 22 and 23 are NAND gates and gate 24 is an inverter. Data defining the gate level implementation created by synthesis process 21 is usually stored in a gate implementation file 25 (FIG. 1). In FIG. 2, f1, f2, and f3 may represent other gates, registers, input ports and/or output ports.

After the gate implementation file 25 has been created, an equivalence checker performs an equivalence check 28 to ensure that the gate implementation file 25 is functionally equivalent to the RTL specification file 18. In other words, the equivalence check 28 verifies that the logic implemented by the gate implementation depicted in FIG. 2 is the same as the logic specified by Table A, hereinabove.

Equivalence checking is a well known process. U.S. Pat. No. 5,754,454 entitled "Method for Determining Functional Equivalence between Design Models," and filed by Pixley, et al. on Mar. 3, 1997, which is incorporated herein by reference, describes a method for performing an equivalence check between two design models, such as the model defined by the RTL specification file 18 and the model defined by the gate implementation file 25, for example. Mapping point pairs are defined in performing equivalence checking. A mapping point pair includes a first mapping point from one of the models and a second mapping point form the other model, wherein the first mapping point corresponds with the second mapping point. In this regard, each mapping point pair defines equivalent points in the two models. Therefore, each mapping point in a mapping point pair should always have the same logical value (provided that the two models are, in fact, functionally equivalent). Mapping point pairs, which are sometimes referred to as "cutpoints" are well known in the art. As an example, Table B shows four sets or pairs of mapping points that define equivalent points between the two models being compared (i.e., between the model defined by the RTL specification file 18 and the model defined by the gate implementation file 22).

TABLE B

| RTL Specification | | Gate Implementation |
|---|---|---|
| c_a | ←→ | A |
| c_b | ←→ | B |
| c_c | ←→ | C |
| . | | |
| . | | |
| . | | |
| c_y | ←→ | X |

After defining the gate implementation file 25 and performing the equivalence check 28, a placement process 32 is performed on the gate implementation file 25 to create gate implementation file 35. During the placement process 32, each gate defined by the gate implementation file 25 is assigned a specific location on a substrate. Therefore, the individual gates defined by the gate implementation file 25 may be shifted or moved with respect to each other by the placement process 32. Once the gate implementation file 35 has been created, an equivalence checker performs an equivalence check 37 to ensure that the gate implementation file 35 is functionally equivalent to the gate implementation file 25. In other words, the equivalence check 37 verifies that the logic implemented by the design of the gate implementation file 25 is the same as the logic implemented by the design of the gate implementation file 35. In performing the equivalence check 37, mapping point pairs between the models defined by the gate implementation file 25 and the gate implementation file 35 are created that define equivalent points between the two models.

After defining the gate implementation file 35, a clock insertion/scan hookup process 42 is performed on the gate implementation file 35 to create gate implementation file 45. During the clock insertion/scan hookup process 42, new logic is synthesized to handle the clock and the scan for the data registers that may be included in the ASIC design. Therefore, new gates may be added to the design by the clock insertion/scan hookup process 42. Once the gate implementation file 45 has been created, an equivalence checker performs an equivalence check 47 to ensure that the gate implementation file 45 is equivalent to the gate implementation file 35. In other words, the equivalence check 47 verifies that the logic implemented by the design of the gate implementation file 45 is the same as the logic implemented by the design of the gate implementation file 35. In performing the equivalence check 37, mapping point pairs between the models defined by the gate implementation file 45 and the gate implementation file 35 are created that define equivalent points between the two models.

The final steps in designing an ASIC circuit are usually implemented in a route process 48 to create gate implementation file 52. During the route process 48, the final layout of the connections that connect the individual gates of the gate implementation file 45 is determined. Therefore, the gate implementation file 52 defines the exact design of the gates and registers as well as the connections therebetween. Once the gate implementation file 52 has been created, the design of the ASIC is complete, and manufacturing of the ASIC may begin. To ensure that the gate implementation file 52 is functionally equivalent to the gate implementation file 45, an equivalence checker performs an equivalence check 57 between the designs of the gate implementation file 52 and the gate implementation file 45. In performing the equivalence check 57, mapping point pairs between the models defined by the gate implementation file 45 and the gate implementation file 52 are created that define equivalent points between the two models. Since each file 18, 25, 35, 45, or 52 created during the design process 15 has been verified to be an equivalent of another file 18, 25, 35, 45, or 52, it is assumed that the design of the gate implementation file 52 is functionally equivalent to the design of the RTL specification file 18.

It should be noted that the aforementioned process 15, as described hereinbefore, defines a complete set of mapping point pairs at each equivalence check 28, 37, 47, and 57. The determination of mapping point pairs at each equivalence check 28, 37, 47, and 57 utilizes a significant amount of processing time and, therefore, reduces the overall efficiency of the process 15.

The present invention is generally an equivalence checking system and method for increasing the efficiency of an ASIC design process by reducing the amount of time to determine mapping point pairs. In accordance with the present invention, an initial equivalence check is performed between two models of an ASIC design process. The mapping point pairs determined during this initial equivalence check are then utilized to perform equivalent checks of other models of the ASIC design process. Therefore, a complete set of mapping point pairs does not need to be generated for each equivalence check, thereby increasing the overall efficiency of the design process.

The equivalence checking system of the present invention, which can be referred to as an "equivalence checker," can be implemented in software, hardware, or a combination thereof. In the preferred embodiment, as illustrated by way of example in FIG. 3, the equivalence checking system 80 of the present invention along with its associated methodology and along with design manager 85 and mapping point file 87 is implemented in software and stored in computer memory 88 (i.e., a storage device) of a computer system 91.

Note that the equivalence checking system 80 can be stored and transported on any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory. As an example, the equivalence checking system 80 may be magnetically stored and transported on a conventional portable computer diskette.

The preferred embodiment of the computer system 91 of FIG. 2 comprises one or more conventional processors 92, such as a digital signal processor (DSP), that communicate to and drive the other elements within the system 91 via a local interface 93, which can include one or more buses. Furthermore, an input device 94, for example, a keyboard or a mouse, can be used to input data from a user of the system 91, and screen display 95 or a printer 96 can be used to output data to the user. A disk storage mechanism 97 can be connected to the local interface 93 to transfer data to and from a nonvolatile disk (e.g, magnetic, optical, etc.). The system 91 can be connected to a network interface 98 that allows the system 91 to exchange data with a network 99.

Figure 3:
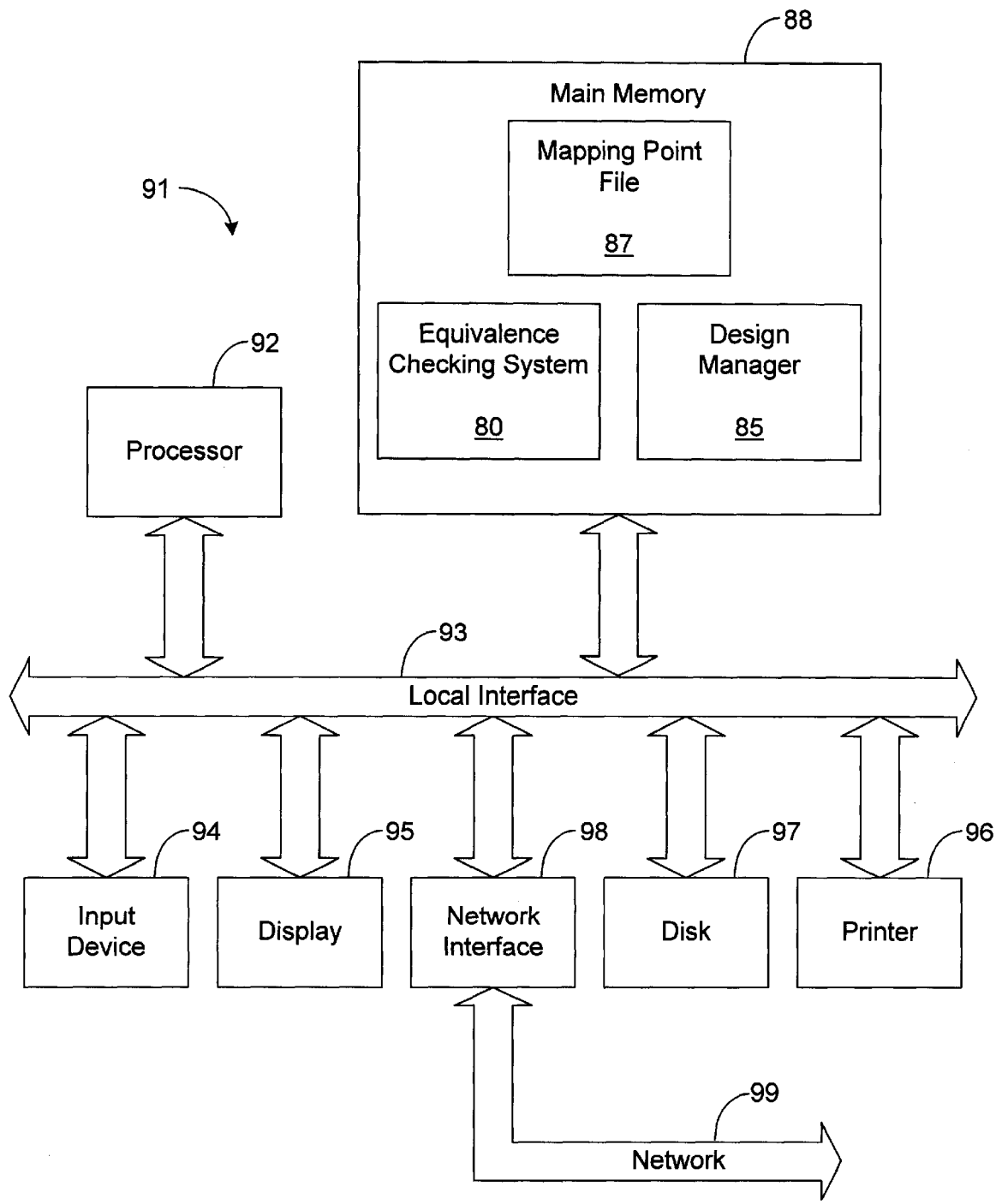
FIG. 3 is a block diagram illustrating a computer system employing the equivalence checking system of the present invention.
Figure 4:
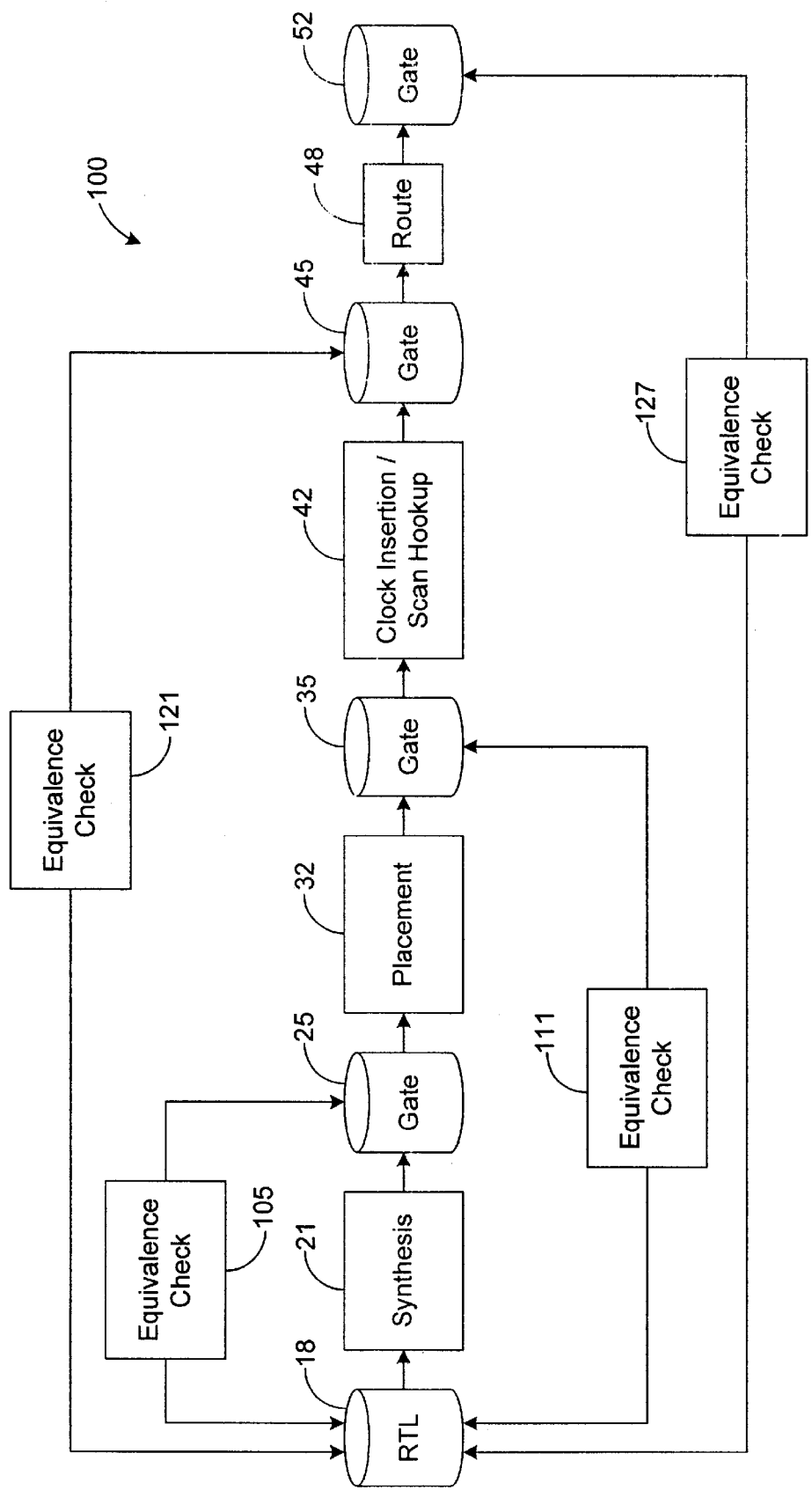
FIG. 4 depicts a process flow diagram of an ASIC design process in accordance with the present invention.

FIG. 4 depicts the process flow of an ASIC design process 100 in accordance with the present invention. First, the logic of the ASIC being designed is defined via an RTL specification, such as the one depicted hereinabove in Table A, which is stored in RTL specification file 18. The design manager 85 (FIG. 3) then performs a synthesis process 21 on the RTL specification to create a gate implementation, such as the one depicted in FIG. 2, of the RTL specification. Data defining this gate implementation is stored in the gate implementation file 25.

Figure 5:
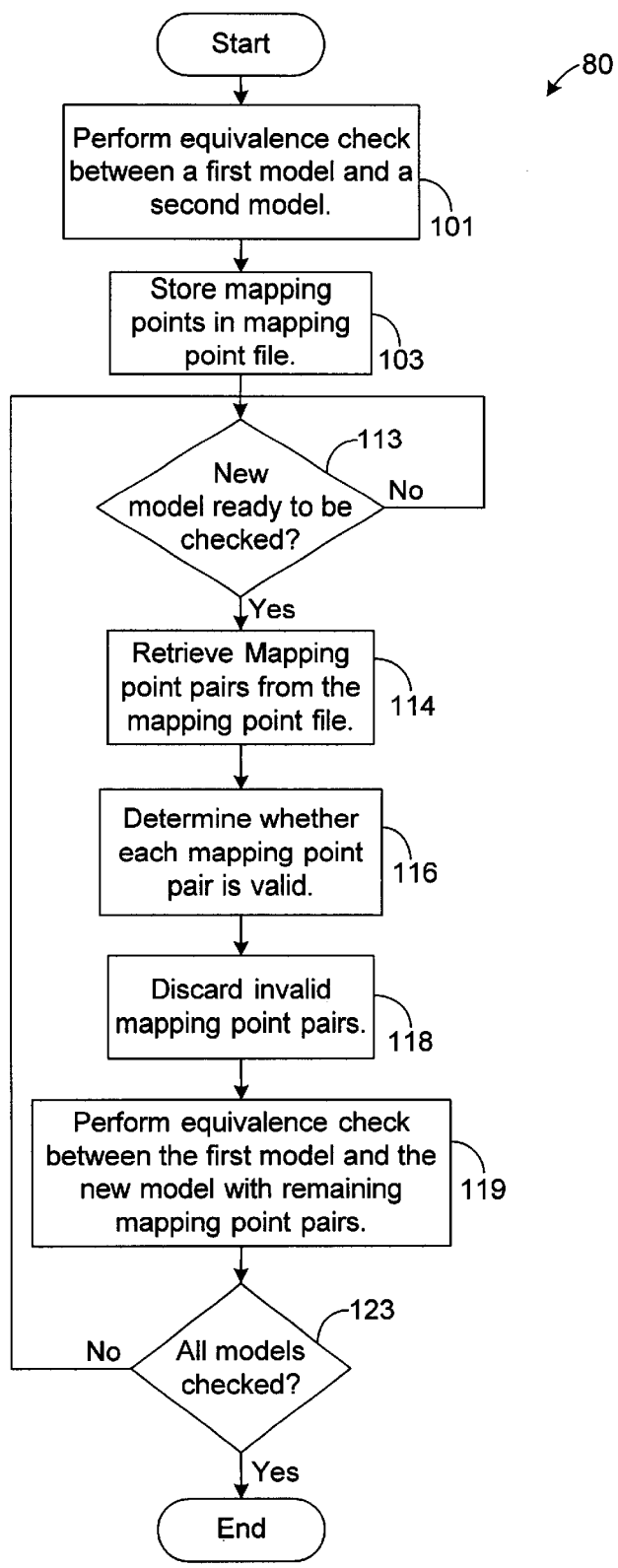
FIG. 5 is a flow chart illustrating the architecture and functionality of the equivalence checking system of FIG. 3.

Next, as shown by block 101 of FIG. 5, the equivalence checking system 80 performs an equivalence check 105 between the RTL specification stored in the RTL specification file 18 and the gate implementation stored in the gate implementation file 25. Similar to conventional techniques for equivalence checking, mapping point pairs are defined for the equivalence check 105. However, unlike many conventional equivalence checking systems, the equivalent checking system 80 of the present invention in block 103 of FIG. 5 stores the mapping point pairs generated by equivalence check 105 into a mapping point file 87 (FIG. 3).

Once equivalence checking system 100 verifies that the gate implementation stored in gate implementation file 25 is functionally equivalent to the RTL specification stored in the RTL specification file 18, the design manager 85 performs a placement process 32, which assigns each gate to a particular location on a substrate. The gate implementation produced by the placement process 32 is stored in gate implementation file 35.

Once the gate implementation file 35 is created, the equivalence checking system 80 performs an equivalence check 111 between the RTL specification in the RTL specification file 18 and the gate implementation in the gate implementation file 35. As shown by blocks 113 and 114 of FIG. 5, the equivalence checking system 80 retrieves the mapping point pairs defined in the mapping point file 87 (FIG. 3), and instead of deriving new sets of mapping point pairs, the equivalence checking system 80 utilizes the retrieved mapping point pairs to perform the equivalence check 111. In this regard, the inventor of the present invention has realized that most of the mapping point pairs defined by the equivalence check 105 are valid mapping point pairs between the RTL specification stored in the RTL specification file 18 and the gate implementation stored in the gate implementation file 35.

As depicted by block 116 of FIG. 5, the equivalence checking system 80 analyzes each retrieved mapping point pair and determines whether each mapping point pair is a valid mapping point pair between the RTL specification stored in the RTL specification file 18 and the gate implementation stored in the gate implementation file 35. As shown by block 118 of FIG. 5, the equivalence checking system 80 discards any of the retrieved mapping point pairs determined to be invalid so that all of the remaining mapping point pairs are valid mapping point pairs between the RTL specification stored in RTL specification file 18 and the gate implementation stored in the gate implementation file 35. As a result, the remaining mapping point pairs may be used to perform the equivalence check 111 in block 119 (FIG. 5), and determination of new mapping point pairs for the equivalence check 111 can either be reduced or eliminated entirely.

Once the equivalence checking system 80 determines that the gate implementation stored in gate implementation file 35 is functionally equivalent to the RTL specification stored in the RTL specification file 18, the design manager 85 performs a clock insertion/scan hookup process 42 to synthesize new logic (i.e., to add new gates) for handling the clock and the scan for the data registers included in the design. The resulting gate implementation is stored in gate implementation file 45. The equivalence checking system 80 then performs an equivalence check 121 to determine whether the RTL specification stored in the RTL specification file 18 is functionally equivalent to the gate implementation stored in the gate implementation file 45. As depicted by blocks 113–123 of FIG. 5 and similar to the equivalence check 111, the equivalence check 121 utilizes the mapping point pairs produced by the equivalence check 105. In this regard, the equivalence checking system 80 retrieves the mapping point pairs from the mapping point file 87 (FIG. 3) and determines whether each mapping point pair is a valid mapping point pair between the RTL specification stored in the RTL specification file 18 and the gate implementation stored in the gate implementation file 45. The equivalence checking system 80, then discards the retrieved mapping point pairs determined to be invalid during the equivalence check 115. The remaining mapping point may then be used to perform the equivalence check 115 through techniques known in the art, for example, the techniques described by U.S. Pat. No. 5,754,454.

Once the equivalence checking system 80 determines that the gate implementation stored in gate implementation file 45 is equivalent to the RTL specification stored in the RTL specification file 18, the design manager 85 performs a route process 48 to define the final layout of the connections between the gates defined by the gate implementation file 45. The resulting gate implementation is stored in gate implementation file 52. The equivalence checking system 80 then performs an equivalence check 127 to determine whether the RTL specification stored in the RTL specification file 18 is functionally equivalent to the gate implementation stored in the gate implementation file 52. As shown by blocks 113–123 of FIG. 5 and similar to the equivalence checks 111 and 121, the equivalence check 127 utilizes the mapping point pairs produced by the equivalence check 105. In this regard, the equivalence checking system 80 retrieves the mapping point pairs from the mapping file 87 and determines whether each mapping point pair is a valid mapping point between the RTL specification stored in the RTL specification file 18 and the gate implementation stored in the gate implementation file 52. The equivalence checking system 80, then discards the retrieved mapping point pairs determined to be invalid during the equivalence check 127. The remaining mapping point pairs may then be used to perform the equivalence check 127 through techniques known in the art, such as the techniques described by U.S. Pat. No. 5,754,454.

To determine whether the retrieved mapping point pairs are valid in equivalence checks 105, 111, 121, and 127, the equivalence checking system 80 first determines whether each retrieved mapping point corresponds to a point in the new model being tested. In this regard, some processes 21, 32, 42, and/or 48 remove connections and/or gates to rearrange or consolidate the design from one model to another model. Therefore, it is possible to remove a portion of a model that corresponds with a mapping point in generating a new model. If this occurs, there is not a point in the new model what corresponds with a mapping point in one of the mapping point pairs, and this one mapping point pair is, therefore, determined to be invalid and is discarded.

Another problem that might be encountered is a "false negative." A "false negative" is well known in the art and is defined as an erroneous failing result within the equivalence checker due to an invalid mapping point pair. The detection of false negatives by equivalent checkers is well known in the art and will not be described in detail herein. When the equivalent checking system 80 of the present invention determines that a mapping point pair is associated with a false negative, the equivalent checking system 80 determines that the mapping point pair is invalid and discards the mapping point pair.

It should be noted that the mapping point pairs stored in the mapping point file 87 do not necessarily have to be generated from the equivalence check 105. In this regard, the present invention allows mapping point pairs generated for an equivalent check between any two models to be used for an equivalent check of another model that is derived from one of the first two models. For example, it is possible to generate a new set of mapping point pairs in equivalence check 111 and to store these new mapping point pairs in mapping file 87. Equivalence check 121 and/or 127 may utilize these new mapping point pairs according to the principles of the present invention.

Furthermore, it should also be noted that processes other than processes 21, 32, 42, and 48 may be used without departing from the principles of the present invention. In this regard, the equivalence checking system 80 of the present invention may be used to perform equivalence checks between different models or implementations regardless of the type of process(es) used to derive the different models or implementations.

In concluding the detailed description, it should be noted that it will be obvious to those skilled in the art that many variations and modifications may be made to the preferred embodiment without substantially departing from the principles of the present invention. All such variations and modifications are intended to be included herein within the scope of the present invention, as set forth in the following claims.

Now, therefore, the following is claimed:

1. A system for determining functional equivalence between models of circuit designs, the system comprising:
   a storage device storing a first circuit model;
   a design manager configured to produce a second circuit model and a third circuit model based on said first circuit model; and
   an equivalence checker configured to determine whether said second circuit model and said third circuit model are functionally equivalent to said first circuit model, said equivalence checker configured to produce mapping point pairs in determining whether said second circuit model is functionally equivalent to said first circuit model, said equivalence checker further configured to utilize said mapping point pairs in determining whether said third circuit model is functionally equivalent to said first circuit model.

2. The system of claim 1, wherein said equivalence checker is further configured to determine whether each of said mapping point pairs is valid with respect to said third circuit model and to discard any of said mapping point pairs determined to be invalid with respect to said third circuit model.

3. The system of claim 1, wherein said first circuit model is a register transfer logic (RTL) specification.

4. The system of claim 1, wherein said first circuit model is a gate level implementation.

5. A system for determining functional equivalence between models of circuit designs, comprising:

means for providing a first circuit model, a second circuit model, and a third circuit model; and means for verifying that said second and third circuit models are functionally equivalent to said first circuit model, said verifying means configured to produce data defining a mapping point pair and to utilize said data to verify that said second circuit model is functionally equivalent to said first circuit model, said verifying means further configured to utilize said data to verify that said third circuit model is functionally equivalent to said first circuit model.

6. The system of claim 5, further comprising:

means for determining whether said mapping point pair is valid with respect to said third circuit model; and means for discarding said data, if said mapping point pair is determined to be invalid with respect to said third circuit model.

7. The system of claim 5, further comprising:

means for storing said data; and means for retrieving said data and for providing said data to said verifying means to enable said verifying means to verify that said third circuit model is functionally equivalent to said first circuit model.

8. The system of claim 5, wherein said first circuit model is a register transfer logic (RTL) specification.

9. The system of claim 5, wherein said first circuit model is a gate level implementation.

10. A method for determining functional equivalence between models of circuit designs, the method comprising the steps of;

providing a first circuit model, a second circuit model, and a third circuit model;

producing mapping point pairs;

verifying that said second circuit model is functionally equivalent to said first circuit model based on said mapping point pairs;

determining that at least one of said mapping point pairs was used to perform said verifying step; and utilizing, based on said determining step, said one mapping point pair to verify that said third circuit model is functionally equivalent to said first circuit model.

11. The method of claim 10, further comprising the steps of:

analyzing, in response to said determining step, said at least one mapping point pair to determine whether said one mapping point pair is valid with respect to said third circuit model, wherein said utilizing step is further based on said analyzing step.

12. The method of claim 10, further comprising the steps of storing said one mapping point pair; and retrieving said one mapping point pair in performing said utilizing step.

13. The method of claim 10, wherein said first circuit model is a register transfer logic (RTL) specification.

14. The method of claim 10, wherein said first circuit model is a gate level implementation.

15. A system for determining functional equivalence between models of circuit designs, the system comprising:

storage device for storing a first circuit model;

a design manager configured to produce a second circuit model and a third circuit model based on said first circuit model; and an equivalence checker configured to produce mapping point pairs based on said first and second circuit models and to determine whether said second circuit model is functionally equivalent to said first circuit model based on said mapping point pairs, said equivalence checker further configured to select at least one of said mapping point pairs based on a determination, by said equivalence checker, that said one mapping point pair was used in determining whether said second circuit model is functionally equivalent to said first circuit model, said equivalence checker further configured to utilize said selected mapping point pair in determining whether said third circuit model is functionally equivalent to said first circuit model.

16. The system of claim 15, wherein said equivalence checker is further configured to determine whether said selected mapping point pair is valid with respect to said third circuit model in response to said determination.

* * * * *